Nov. 21, 1972 W. LUGSCHEIDER 3,703,447

METHOD OF COATING NIOBIUM WITH COPPER

Filed March 27, 1970 2 Sheets-Sheet 1

3,703,447

METHOD OF COATING NIOBIUM WITH COPPER

Walter Lugscheider, Erlangen, Germany, assignor to Siemens Aktiengesellschaft, Berlin, Germany Filed Mar. 27, 1970, Ser. No. 23,359
Claims priority, application Germany, Mar. 29, 1969, P 19 16 292.6
(Filed under Rule 47(b) and 35 U.S.C. 118)
Int. Cl. C23b *5/52*
U.S. Cl. 204—37 R 14 Claims

ABSTRACT OF THE DISCLOSURE

A method of coating niobium with copper has the steps of bringing the metallically pure surface of the niobium to be coated into contact with copper that is metallically pure at least at the surface and heating the niobium to a temperature between 800° C. and 2500° C. under a vacuum with a residual gas pressure of at most $10^{-6}$ torr, whereby the copper is joined to the niobium.

My invention relates to a method of coating niobium with copper.

In the production of various superconductive components such as resonators for particle accelerators, superconductive cables especially for alternating current and band-type alternating current conductors, it is often desirable to join niobium to a carrier metal. For this purpose, copper is especially suitable because of its good mechanical workability and its high electrical and thermal conductivity for electrically stabilizing the niobium, the latter serving as the superconductor. The copper can take over a current flowing in the superconductive niobium at least for a time at the transition of the niobium from the superconducting to the electrically normal conducting state and thereby relieve the niobium of its load. In addition, the copper diverts arising heat losses such as those produced by alternating current losses to an adjoining cooling means like liquid helium.

The known methods of coating copper with niobium by means of fusion electrolytic deposition of niobium on a copper carrier are often not usable, since the niobium often cannot be deposited on a prefinished copper carrier. Instead, the copper must be joined to prefinished niobium parts. This is the case when niobium has to be annealed for several hours under ultra-high vacuum at a temperature of over 2000° C., for example, for improving various superconductive characteristics, especially increasing the transition temperature and reducing the high-frequency surface resistance. Because of the low melting temperature of the copper, such an annealing treatment of a niobium layer deposited on a copper carrier is not possible, since already with temperatures near the melting point of the copper, changes in shape of the copper carrier occur through creeping actions which are intolerable for later applications. In this case, the niobium must therefore first be annealed alone and can first be joined to the copper after annealing. Also, in other cases such as for assembly reasons, it can be required that the niobium parts be assembled first and then joined with copper. The foregoing have been prevented up to now because with the conventional methods such as through the galvanic deposition of copper, no tight holding copper layer on niobium is obtainable.

Accordingly, it is an object of my invention to provide a method of coating niobium with copper. Subsidiary to this object, it is an object of my invention to provide a method of applying a tight-holding layer of copper to a niobium surface.

According to a feature of the invention, the metallically pure niobium surface to be coated is brought into contact with copper metallically pure at least at its surface and by subsequently heating the niobium to a temperature of between 800 and 2500° C. under vacuum having a residual gas pressure of not more than $10^{-6}$ torr, the copper is joined to the niobium.

With the application, according to the invention, of metallically pure surfaces of the niobium and of copper, as well as by the heating under vacuum with a residual gas pressure of $10^{-6}$ torr or less, the difficulties are overcome in an unexpected manner, these difficulties having until now prevented the formation of a tight-holding band between niobium and copper. Of essential significance is that the niobium is heated and the copper standing in contact with the niobium is warmed by the heated niobium and is bonded or joined to the niobium.

In the event that the niobium is heated in accordance with the method of the invention to a temperature between 800° C. and the melting temperature of copper of about 1083° C., it is preferable to hold the niobium at this temperature for at least ten minutes. In this temperature range between 800° C. and the melting temperature of the copper, the surface of the copper standing in contact with the niobium is not yet melted. Instead, the copper diffuses into the niobium whereby a reaction layer is formed at the separating plane between the niobium and copper. The reaction layer serves to tightly hold the copper to the niobium. Should a more intense diffusion of the copper into the niobium be desired, the heat can be applied for ten minutes and extended therefrom to several hours.

In contrast, if the niobium is heated in accordance with the method of the invention to a temperature between the melting temperature of copper of about 1083° C. and 2500° C., it is preferable to hold the temperature at this level for about 0.1 second to no higher than 2 minutes. In this temperature range, the copper melts at least at the surface thereof standing in contact with the niobium and in a molten state, very rapidly forms an alloy layer with the niobium. In this temperature range it has been found to be especially advantageous to heat the niobium to a temperature in the approximate range of 1100 to 1200° C. and to hold this temperaure for about 2 minutes. The use of the short heating times are preferable in the region of higher temperatures.

To obtain a metallically pure surface, it is advantageous to anneal the niobium in a vacuum with a residual gas pressure of not higher than $10^{-8}$ torr for at least about 5 minutes at a temperature between 2000 and 2500° C. This provides special advantages in the production of superconductive resonators for particle accelerators, whereby an essential improvement in various superconductive characteristics is achieved.

In the event that such a degasification annealing is not required, the niobium can be advantageously chemically or electrolytically polished to obtain a metallically pure surface. The surface can also be cleaned mechanically such as by grinding or sandblasting.

There are various possibilities for applying the copper to the niobium surface to be coated. According to a preferred embodiment of the method of the invention, the copper, which is metallically pure at least on the surface, is brought in massive form into contact with the metallically pure niobium surface to be coated. The method is especially well suited for plating niobium sheets or bands. To obtain a metallically pure surface, it is advantageous to electrolytically or chemically polish the copper before it is applied to the niobium surface.

With an alternate embodiment of the method according to the invention, the copper is electrolytically deposited on the niobium surface to be coated. The pure copper surface is applicable for this purpose by itself. This embodiment of the method of the invention is especially suited to coat niobium parts of such geometric form which would cause difficulties when applying copper in massive form. To achieve a tight-holding bond between niobium and copper, the niobium coated electrolytically with copper is advantageously heated in a vacuum having a residual gas pressure of not higher than $10^{-6}$ torr. The heat is first applied so as to increase the temperature at a rate of about 100° C. per minute to an approximate range between 1060 to 1075° C. and then held at this temperature for about ten minutes to 2 hours. This embodiment of the method affords the advantage, that during the period when the temperature is slowly climbing, the copper deposited electrolytically on the niobium is sintered together to form a copper layer which is tightly held together, and subsequentely, a tight diffusion bond is obtained between the niobium and copper at a temperature of 1060 to 1075° C. lying just under the melting point of copper.

There also exist various possibilities of heating the niobium. With an advantageous embodiment of the method of the invention, which is especially suitable for coating rotation-symmetric formed niobium bodies the niobium is heated by an electron beam on the surface opposite to that which is to be coated.

With another embodiment of the method according to the invention for coating niobium bands with copper, the niobium in band form is brought into contact with band-formed copper and heated by means of a high-frequency heating coil surrounding both bands. Because of the higher electrical resistance of the niobium, the primary portion of the heat generated by means of the high-frequency heating develops in the niobium so that the copper is heated from the niobium. By means of high-frequency impulses, very short heating times of parts of seconds are achieved.

Also other techniques of heating are suitable, for example, the heating by direct current passage or by means of indirect radiation heating, for heating the niobium in accordance with the method of the invention. The last-mentioned heating techniques are especially suitable for coating niobium sheets with copper.

The copper layer applied to the niobium can be used as an intermediate layer for joining the niobium with other metals. The copper layer joined with the niobium can be joined with other metals by means of galvanic techniques, soldering or hot-rolling for example. This is of special significance, since the joining of niobium with other metals as a rule provides the greatest difficulties.

The method according to the invention will now be described with reference made to the accompanying drawings in which.

Figure 1:
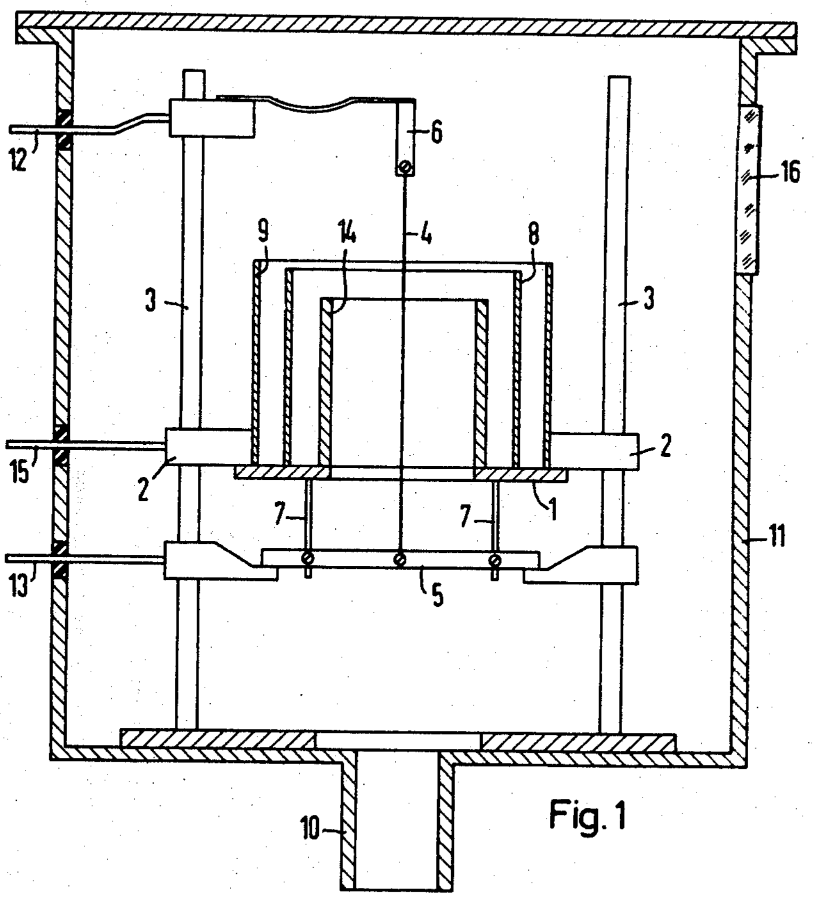
FIG. 1 is a schematic illustration, partially in section, of an apparatus used to perform the method of the invention in accordance with various embodiments thereof.

The following will illustrate the method of the invention as applied to the copper coating of a niobium cylinder using the apparatus of FIG. 1. The apparatus serves to heat the niobium cylinder by means of an electron bombardment and comprises essentially a niobium plate 1 having an opening. The plate 1 is secured with niobium clamps 2 and aluminum-oxide rods 3. A tungsten cathode 4 is disposed perpendicular to the surface of plate 1 and extends through the opening therein. The cathode 4 is stretched between holding members 5 and 6 made of niobium which are secured to the aluminum oxide rods 3. The cathode 4 is provided with electric current via members 5 and 6. Between the member 5 and the niobium plate 1, additional supports of thin aluminum oxide rods 7 are provided. Two concentric niobium cylinders 8 and 9 serve as ray reflectors. The apparatus is disposed in a stainless steel tank 11 which is to be evacuated through a pipe socket 10. The current-supply leads 12 and 13 for heating the cathode 4 are led out of the tank 11 through vacuum-tight openings.

The niobium cylinder 14 to be coated with copper consists of a niobium sheet 3 mm. thick, has a height of 41 mm. and a diameter of 42 mm. The cylinder 14 is first placed in the apparatus of FIG. 1 to obtain a metallically pure niobium surface. The apparatus is then evacuated to a residual gas pressure of about $10^{-8}$ torr. A high voltage is then applied between the cathode 4 and cylinder 14 which serves as the anode via the leads 13 and 15. The cylinder 14 is heated by electron bombardment for about 30 minutes to a temperature of about 2050° C. The temperature is optically measured through a viewing glass 16 in the wall of the tank 11. After cooling, the cylinder 14 is removed from the apparatus.

Figure 2:
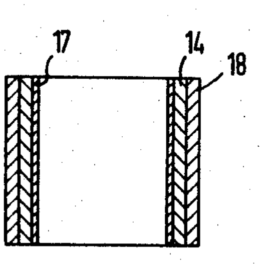
FIG. 2 illustrates a longitudinal view of a niobium cylinder, with a copper layer deposited electrolytically on the outer surface.

After this degasification annealment, the cylinder, as shown in FIG. 2, is provided with a polycarbonate-lacquer coating 17 on its inner wall and is galvanically coated with a copper layer 18 on its outer wall. To obtain the copper layer 18, the cylinder can be placed as cathode in an electrolytic bath consisting of an aqueous copper sulfate solution wherein the copper sulfate is 20% by weight. A copper cylinder having a greater diameter than the niobium cylinder 14 serves as the anode and is disposed so as to be concentric therewith. With a direct-current voltage of about 3 to 4 volts between cathode and anode and a current density of about 50 to 70 ma./cm.$^2$, about 1 $\mu$m. coating of copper is applied to the cylinder 14 in about 5 minutes. The cylinder 14 is removed from the electrolyte when the copper layer 18 has reached a thickness of about 1 mm. The copper layer 18 is held loose on the cylinder 14.

Figure 3:
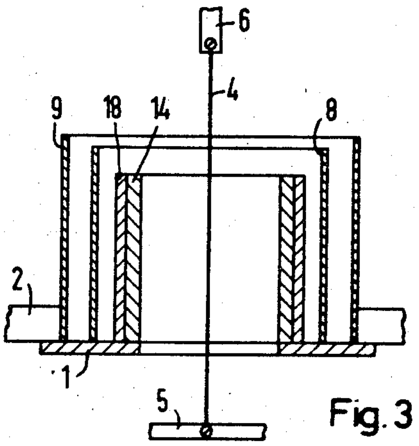
FIG. 3 is a cut-out portion of the apparatus according to FIG. 1 with a cylinder according to FIG. 2.

After the lacquer is removed with chloroform and the cylinder rinsed to remove traces of electrolyte, the cylinder is placed again in the apparatus of FIG. 1. A portion of the apparatus with the cylinder is shown in FIG. 3. After the apparatus is evacuated to a residual gas pressure of about $10^{-7}$ torr, the cylinder 14 is heated by electron bombardment so that the temperature slowly increases at the rate of about 100° C./min. to a temperature of about 1060 to 1075° C. The cylinder is held at this temperature for about 2 hours, whereby the copper sinters together and forms at the separation plane a small reaction layer between the niobium and copper by diffusion. After cooling, the copper coating cylinder 14 is removed from the apparatus.

Figure 4:
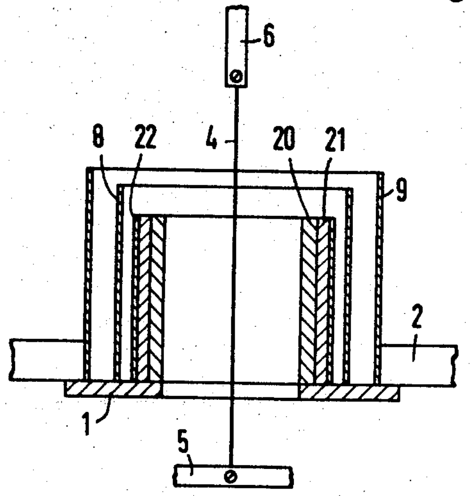
FIG. 4 shows a cut-out portion of the apparatus according to FIG. 1 with a niobium cylinder for another embodiment of the method according to the invention, the niobium cylinder being surrounded by a massive copper cylinder.

Referring to FIG. 4, another embodiment of the method of the invention will now be described wherein a niobium cylinder is coated with massive copper. The niobium cylinder 20 is first electrolytically polished in order to obtain a metallically pure surface. The cylinder 20 is placed as anode in a bath consisting of sulfuric acid 85% by volume and hydrofluoric acid 15% by volume. Niobium serves as the cathode. Within a voltage between anode and cathode of about 5 to 9 volts and a current density of about 20 ma./cm.$^2$ at the anode, niobium is removed from the surface of the cylinder at the rate of 1 $\mu$m. per minute. After about 2 to 10 minutes, the cylinder 20 is removed from electrolyte and cleaned so as to remove traces thereof.

A copper cylinder 21 is placed over the niobium cylinder 20 so as to form a good fit such that the outer wall of cylinder 20 and the inner wall of cylinder 21 touch each other closely.

Before its placement over the niobium cylinder, the copper cylinder is likewise electrolytically polished to obtain a metallically clean surface. For this purpose, the copper cylinder is placed as anode in an electrolyte of orthophosphoric acid ($H_3PO_4$) and water with a mixing ratio of 1:1. Copper serves as the cathode. The cell voltage is about 4 to 5 volts and the current density at the anode is about 50 ma./cm.$^2$.

A good fitting nickel cylinder 22 having a wall thickness of 1 mm. is pulled over the copper cylinder 21 which in turn was placed over the niobium cylinder 20. The cylinders 20 to 22 are then placed in the apparatus of FIG. 1 as illustrated in FIG. 4 wherewith it is noted that the niobium cylinder 20 and the nickel cylinder 22 sit closely on iobium plate 1. After the apparatus is evacuated to a residual gas pressure of about $10^{-6}$ to $10^{-7}$ torr, the niobium cylinder 20 is heated by electron bombardment until just over the melting temperature of the copper, i.e. to about 1100° C. The cylinder 20 is held at this temperature for about 2 minutes, whereby the copper and niobium are fushion joined. The nickel cylinder 22 acts to prevent the running off of melted copper. After cooling, the copper coated cylinder is removed from the apparatus.

Still another embodiment of the method of the invention will now be described wherein a niobium band is coated with copper using the apparatus illustrated in FIG. 5. This apparatus consists essentially of an evacuated tank 31 in which a water cooled high-frequency heating coil 32 is arranged. The niobium band 33 to be coated is placed in the tank 31 wound on a delivery reel 34. In addition, a copper band 35 which serves to coat the niobium band 33 is placed in the tank wound on a delivery reel 36. The two bands 33 and 35 are first directed between two transport rollers 37 which press the bands together. The bands 33 and 35 are then pulled through the high-frequency heating coil 32; then the bands pass between the pressing rollers 38 and are wound on a motor driven reel 39.

Figure 5:
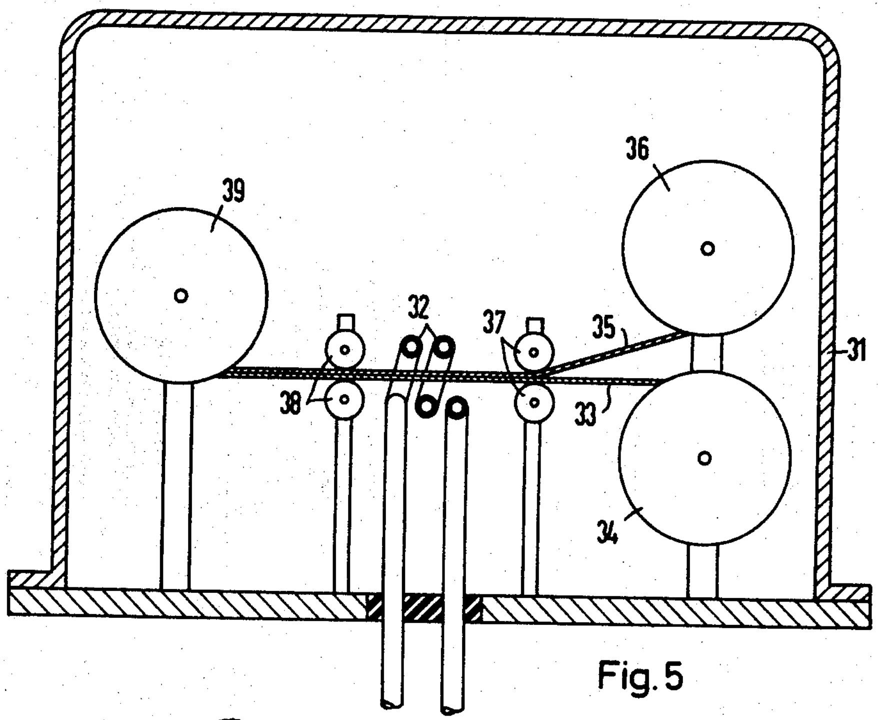
FIG. 5 shows schematically an apparatus for performing another embodiment of the method according to the invention.

Before the bands 33 and 35 are placed in the apparatus of FIG. 5, they are chemically polished so as to have metallically clean surfaces. For this purpose, the niobium band is placed in polishing liquid consisting of nitric acid, hydrofluoric acid and water in a volume rato of 1:2:4. The copper band 35 is cleaned with thinned nitric acid. After placing the bands 33 and 35 in the tank 31, the latter is evacuated to a residual gas pressure of at least $10^{-6}$ torr. Then the appropriate part of the niobium band 33 is heated to a temperature of about 1100 to 1200° C. in the high-frequency heating coil 32. The copper band 35 is melted on the surface standing in contact with the niobium band 33 when the bands are pulled through the high-frequency heating coil 32 with a speed of several millimeters per second, so that an alloy joining between the bands is formed.

With all embodiments of the method of the invention, there results an adhesive strength of the copper on the niobium which is greater than the strength of the copper itself.

Figure 6:
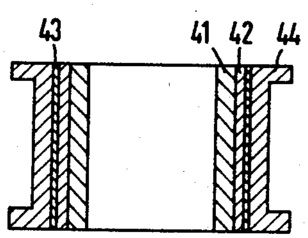
FIG. 6 illustrates a niobium part coated with copper, whereby the copper layer forms an intermediate layer to bind the niobium with another metal.

FIG. 6 shows the application of a copper layer applied in accordance with the method of the invention. The copper layer serves as an intermediate layer for joining other metals. A niobium cylinder 41 coated at its outer surface with a copper layer 42 is soldered to a metal cylinder 44 by means of a soft-solder 43. The soft-solder 43 can be for example a lead-tin alloy and the cylinder 44 can be made of brass. The soldering temperature is about 280° C.

To those skilled in the art, it will be obvious upon a study of this disclosure, that the invention permits of various modifications and hence may be given embodiments other than illustrated and described herein, without departing from the essential features of the invention and within the scope of the claims annexed hereto.

I claim:

1. A method of coating niobium with copper comprising the steps of bringing the metallically pure surface of the niobium to be coated into contact with copper that is metalically pure at least at the surface, and then heating the niobium to a temperature between 800° C. and 25° C. under a vacuum with a residual gas pressure of at most $10^{-6}$ torr, whereby the copper is joined to the niobium.

2. The method according to claim 1 wherein the niobium is heated to a temperature between 800° and the melting temperature of copper of about 1083° C. and held at this temperature for at least ten minutes.

3. The method according to claim 1 wherein the niobium is heated to a temperature between the melting temperature of copper of about 1083° C. and 2500° C. and held at this temperature for about 0.1 second to at most 2 minutes.

4. The method according to claim 3 wherein the niobium is heated to a temperature in the approximate range of 1100 to 1200° C. and held at this temperature for about 2 minutes.

5. The method according to claim 1 wherein the method includes the initial step of annealing the niobium under a vacuum with a residual gas pressure of at most $10^{-8}$ torr at a temperature between 2000° and 2500° C. for at least about 5 minutes, whereby the surface of the niobium is cleaned so as to be metallically pure.

6. The method according to claim 1 wherein the method includes the initial step of chemically polishing the niobium, where the surface of the niobium is cleaned so as to be metallically pure.

7. The method according to claim 1 wherein the method includes the initial step of electrolytically polishing the niobium, whereby the surface of the niobium is cleaned so as to be metallically pure.

8. The method according to claim 1 wherein the metallically pure surface of the niobium to be coated is brought into contact with copper of solid form that is metallically pure at least at the surface.

9. The method according to claim 8 wherein the method includes the initial step of electrolytically polishing the copper, whereby the surface of the copper is cleaned so as to be metallically pure.

10. The method according to claim 8 wherein the method includes the initial step of chemically polishing the copper, whereby the surface of the copper is cleaned so as to be metallically pure.

11. The method according to claim 1 wherein the surface of the niobium to be coated is brought into contact with the copper by an electrolytic deposition of the latter.

12. The method according to claim 11 wherein the niobium coated with the electrolytically deposited copper is heated under a vacuum with a residual gas pressure of at most $10^{-6}$ torr at the rate of 100° C. per minute to a temperature in the approximately range of 1060 to 1075° C. and held at this temperature for a period in the approximate range of 10 minutes to 2 hours.

13. The method according to claim 1 wherein the niobium is heated by an electron bombardment of its surface facing away from the surface to be coated.

14. The method according to claim 1, wherein the niobium band form is brought into contact with the copper in band form and both bands in mutual contact are passed through a high-frequency heating coil which surrounds both bands, the niobium band is heated thereby and the copper band is bonded with the niobium band by the heat which transfers from the niobium band to the copper band.

References Cited

UNITED STATES PATENTS

| | | | |
|---|---|---|---|
| 3,057,048 | 10/1962 | Hirakis | 204—37 R |
| 3,439,188 | 4/1969 | Glover et al. | 204—37 R |
| 3,466,237 | 9/1969 | Barber | 204—37 R |
| 3,461,047 | 8/1969 | Jenny | 204—37 R |
| 3,314,867 | 4/1967 | Gore et al. | 204—32 R |
| 2,653,210 | 9/1953 | Becker et al. | 219—9.5 |
| 3,366,768 | 1/1968 | Osborn, Jr. | 219—9.5 |
| 3,293,008 | 12/1968 | Allen et al. | 117—62 |

JOHN H. MACK, Primary Examiner

W I. SOLOMON, Assistant Examiner

U.S. Cl. X.R.

29—199; 117—62; 204—32 R